United States Patent [19]

Kawakami

[11] 3,739,298

[45] June 12, 1973

[54] BROAD BAND TUNABLE SOLID STATE MICROWAVE OSCILLATOR

[75] Inventor: Kenneth Nobuo Kawakami, Thousand Oaks, Calif.

[73] Assignee: Litton Systems, Inc., San Carlos, Calif.

[22] Filed: Jan. 12, 1972

[21] Appl. No.: 217,153

[52] U.S. Cl. .................. 331/99, 331/68, 331/107 G

[51] Int. Cl. .............................................. H03b 7/14

[58] Field of Search .................. 331/96, 99, 107 G, 331/107 R, 107 T, 68

[56] References Cited

UNITED STATES PATENTS

| | | | |
|---|---|---|---|
| 3,512,105 | 5/1970 | Lance, Jr. et al. | 331/99 X |
| 3,638,143 | 1/1972 | Higashi et al. | 331/107 G X |
| 3,659,222 | 4/1972 | Assour et al. | 331/99 |
| 3,668,553 | 6/1972 | Dunn et al. | 331/96 |

*Primary Examiner*—Roy Lake
*Assistant Examiner*—Siegfried H. Grimm
*Attorney*—Ronald M. Goldman, Alan C. Rose and Alfred B. Levine

[57] ABSTRACT

Broad band tunable solid state oscillator includes a microwave frequency generating diode; a capacitance, suitably a varactor; and an open wire transmission line of either two or three spaced conductors as a frequency determining element. The line is open along its sides and is in open communication with a bounded cavity and microwave loss material is disposed in the cavity to impart a low-Q characteristic thereto. In additional aspects the foregoing elements are arranged into a compact container which integrates therewith direct current paths from the diode and varactor for connection to external DC bias voltage sources.

21 Claims, 11 Drawing Figures

BROAD BAND TUNABLE SOLID STATE MICROWAVE OSCILLATOR

FIELD OF THE INVENTION

This invention relates to solid state microwave frequency oscillators and, more particularly, to microwave frequency Gunn diode oscillators having a wide-band tuning characteristic.

BACKGROUND OF THE INVENTION

Various types of semiconductors, including transistors and, more particularly, microwave diodes, possess the ability to act as active sources or generators of microwave energy. Among these diodes are the IMPATT diode, the tunnel diode, and the GUNN diode. Although the exact physical mechanics by which microwave energy generation occurs differs from device to device, abstractly in the broadest sense they are related in that when properly biased, they present to the external circuitry an impedance whose real part is less than zero, a characteristic commonly denoted "negative resistance." Hence, coupled into a resonant circuit and to a resistive load that may comprise the resonant circuit and biased into the negative resistance region, instability in the form of oscillations may occur such that at the frequency of oscillation, the impedance of the active device will be equal to the negative of the impedance presented to it by the external circuit. The Gunn diode, sometimes referred to as a transferred electron device (TED), consists of a crystal of two elements, gallium and arsenide, that preferably has been "supercritically doped" with an impurity such as tellurium, tin, silicon, selenuim, or equivalent. In this mode, theoretically, the application of a suitable biasing potential across the diode and suitable coupling to a load causes movement of electrons through the crystal in "domains" or "groups." It may occur that one group or domain transverses the length of the crystal before a subsequent domain is created. In this mode, the frequency of oscillation is inherently related to the transit time of the domain through the crystal. An ancillary phenomenon associated with the foregoing is the "delayed domain," i.e., the generation of a succeeding domain can be delayed a slight amount after the preceding domain has transversed the crystal and has been discharged. On this basis, changing the frequency of oscillation corresponds to a change in the period between domain formation. The foregoing provides brief introduction into the mechanics of the Gunn diode and the reader is referred to widely available literature on the subject for a more rigorous scientific and mathematical treatment.

Of the solid state devices, the Gunn diode has been noted as a promising active element for the generation of microwave energy because of its capability for providing high power with low noise. Power outputs of a half-watt are currently available. Moreover, it is capable of being varactor-tuned over wide ranges of frequency as is known and as is noted in Volume 59, No. 8 issue (August 1971) *Proceedings of the IEEE*. Thus it is in connection with the Gunn diode type of active device that the present invention is best considered.

An oscillator generates a signal of a particular frequency in the microwave frequency bands dependent upon electrical circuit parameters which form a resonant or tank circuit. Tuning is accomplished by changing of one or more of those circuit parameters so that the frequency of oscillation is changed. "Wide-band" tuning, as generally accepted, denotes tuning over at least 15 percent of an octave. As reported and known to this person, Gunn diode oscillators available prior to my invention are of 20 percent of an octave in bandwidth and, insofar as is known, none are commercially available which are capable of being tuned over a greater band of frequencies.

In all devices designed for operation in the microwave frequency range small dimensions and tolerances become a critical factor. For example, at a frequency of 10 GHz a half-wavelength is approximately only 1.5 centimeters in length and, in operating with tuned circuits, a slight change in spacing can have a major effect on the effective electrical characteristics of the resonant circuit. Since any oscillator unit has many parts and interconnections, the problem is multiplied many times over. As a result, factory adjustment of the oscillator has been a highly complex and tedious series of laboratory adjustments in contrast to a simple mechanical assembly line operated by semi-skilled personnel.

In one Gunn diode oscillator attributed to Messrs. Warner and Hermann, a Gunn diode is disposed in a cylindrical coaxial cavity and a varactor is coupled to the fields within the coupling cavity inductively by a loop of wire, and the output coupling for transmitting microwave energy out of the cavity does so by a similar inductive coupling with the fields in the cavity comprising a loop of wire. Such prior art oscillator structure has only a 10 percent of an octave tuning bandwidth. And adjustment of the oscillator requires proper placement of the output coupling loop and varactor coupling loop; the correct depth and alignment of each loop must be located in the cavity, empirically, for each oscillator constructed even though the oscillators are of the same construction for operation at the same frequency. Even after positioning the loops, the loops must thereafter be clamped in position without disturbing the position of the loops. Because seemingly small mechanical distortions at these high frequencies of 10 GHz can change those positions, clamping the elements is a very difficult maneuver in itself. Obviously, these adjustment procedures requiring individual "tailoring" renders the oscillator assembly more time consuming and expensive than is desirable for a high production item.

OBJECTS OF THE INVENTION

Accordingly, it is one object of my invention to provide a novel wide-band voltage tunable solid state microwave oscillator.

It is a further object of my invention to provide a Gunn diode microwave frequency oscillator that is tunable over a wide band of frequencies.

And it is a still further object of my invention to provide a Gunn diode microwave frequency oscillator that is relatively inexpensive and simple to manufacture and adjust.

BRIEF SUMMARY OF THE INVENTION

In accordance with the foregoing objects, the oscillator of the invention includes an open sided microwave transmission line that contains at least two spaced electrical conductors; short circuit terminating means at each of the front and back ends of the transmission line for providing an effective short circuit to microwave frequency signals; a solid state semiconductor type microwave energy generating device, suitably a Gunn diode, located between an end of one of the transmission line conductors and the juxtaposed second terminating means with the remaining end of that transmission line conductor being in contact with the first terminating means so as to place the latter two electrically in common; a variable capacitance, suitably a varactor, is placed between the two transmission line conductors, preferably in the proximity of the microwave generating device, to provide an effective electrical capacitance between said two conductors and which in combination with the transmission line provides a microwave frequency determining circuit for the diode; a shield is placed about the transmission line and defines a cavity region which is open to and in communication with the open sides of the transmission line throughout the entire length of the line; additionally, microwave lossy material is included in the cavity region to assure that the cavity region is free of microwave frequency resonances to prevent such resonances from influencing the frequency of oscillation of the oscillator; and coupling means are provided to couple microwave frequency energy from the oscillator through the shield.

Further, in accordance with the invention, the Gunn diode is coupled electrically in series between the end of the second conductor and one of the terminating means so as to provide a direct current electrical path therebetween, and the varactor is connected electrically in series between the first and second conductors of the transmission line so as to provide a DC electrical path therebetween. The other terminating means is DC electrically insulated to direct current from the first conductor and the second conductor is DC electrically insulated from the terminating means and the shield. In accordance with this aspect of the invention, the respective bias sources are connected between each of the second conductor and the second terminating means and the first terminating means.

Further in accordance with the invention, one, the other, or each of the first and second conductors forming the transmission line are adjustably mounted so as to permit relative movement toward and away from one and thus permit adjustment of the characteristic impedance of the line.

An additional aspect of the invention is that the terminating means each comprise electrically conductive surfaces which have a surface area larger than that of the transmission line and border the cavity region formed by the shielding means.

Suitably, in accordance with a still further aspect of the invention, the first conductor of the transmission line comprises a post-like cylindrical geometry and the second conductor of the transmission line comprises a rectangular geometry with a flat edge oriented spaced from and parallel with the first conductor. Suitably the height of the second conductor is large enough to extend through the shield and is insulated therefrom to permit the conductor spacing to be adjusted from the exterior of the shielding means.

The accomplishment of the foregoing objects of my invention as well as the attendant advantages of the invention, together with the structure comprising the preferred embodiments of my invention and the mode of operation thereof as well as equivalents and substitutions for the elements thereof, becomes more apparent with an understanding of the detailed description of the preferred embodiments of my invention which follows, taken together with the figures of the drawings.

DETAILED DESCRIPTION OF THE INVENTION

Figure 1:
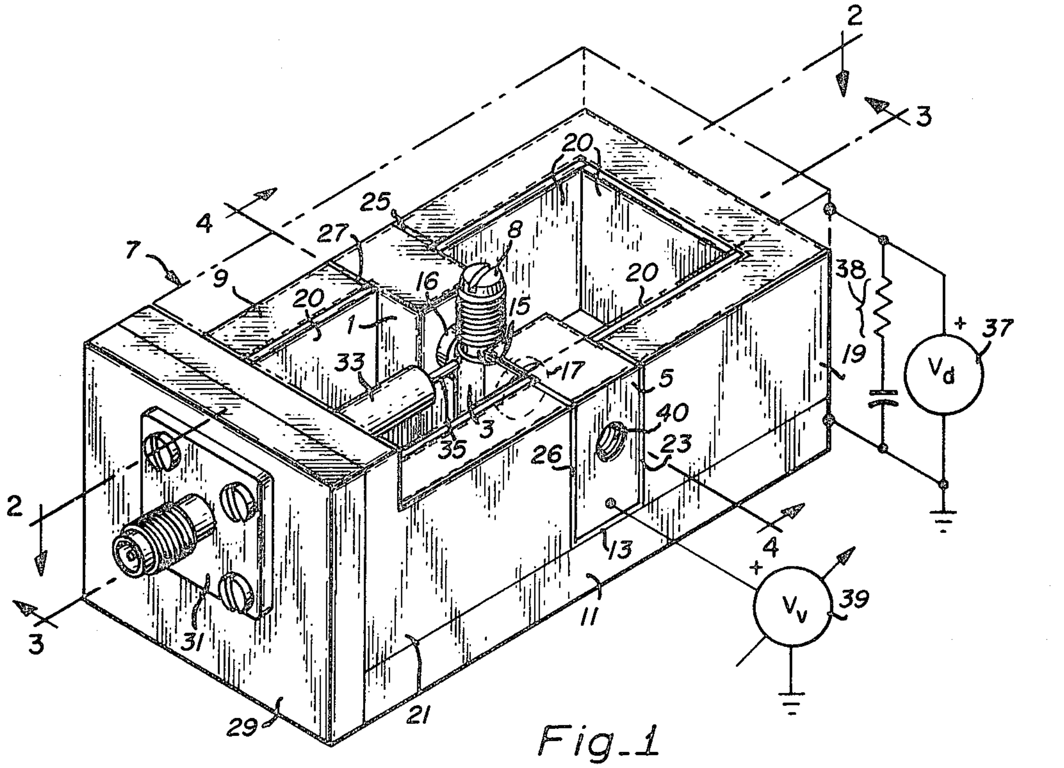
FIG. 1 illustrates in perspective one embodiment of the oscillator of my invention.

FIG. 1 shows three spaced electrically conductive members or conductors 1, 3, and 5, suitably of copper. Conductors 1 and 5 are of a rectangular shaped geometry and have edges confronting and spaced from one another. Conductor 3 is of a cylindrical geometry or post and is of a slightly lesser height than conductors 1 and 5, for reasons which hereinafter become apparent. Conductor 3 is located in between and spaced equally from the confronting edges of the adjacent conductors. Preferably the axis of conductor 3 is substantially parallel with that of the adjacent conductors. As is evident, the three conductors form a three wire type of open sided microwave transmission line. The length of this transmission line corresponds to the height dimension of the conductors in the figure. Suitably the transmission line so formed is approximately 0.25 inches to equal 0.21 wavelengths at a frequency, by way of example, of 10 GHz.

As thus becomes apparent, FIG. 1 and the other illustrations of the embodiments are or may be somewhat enlarged in size and geometry in order to provide clear illustration of its construction. Given this description of my invention, specific dimensions and alternative dimensions as well as other conventional details become a matter of choice and selection to those skilled in this or related sciences.

A covering plate-like member 7 of electrically conductive material, suitably copper, indicated by the dashed lines and illustrated as invisible to render the other elements visible in the figure, is located at one end of the transmission line conductors. A tapped passage overlying the end of conductor 3 is included in plate 7 and a metal screw 8, indicated by dashed lines, is inserted within the passage and protrudes through the underside of plate 7. A mica insulator 9, represented by dashed lines, fits between the underside of the plate 7 and electrically insulates the plate from the top ends of each of the conductors and from other elements of the oscillator structure. A similar metal plate 11, also suitably copper, is located on the bottom and lies under the bottom end of conductors 1, 3 and 5. Suitably, a rectangular shaped mica insulator 13 is located between the bottom of conductors 5 and plate 11 and electrically insulates plate 11 from contact with the ends of conductors 1 and 5. A like insulator, not illustrated, is located between the bottom end of conductor 1 and plate 11 to electrically insulate the two members. Mica insulator 9 is of the rectangular shape of a picture frame having two opposed projecting rectangular portions so as to cover the top end surfaces of the conductors 1 and 5. Conductor 3 is directly secured to plate 11 at the bottom end of the conductor, not visible in the figure, which places conductor 3 electrically and mechanically in contact therewith.

A Gunn diode 15 is located between the inner surface of plate 7 and the top end of conductor 3. Although a Gunn diode is illustrated in the embodiment, any other semiconductive device having a negative resistance characteristic suitable for use as an active microwave source and of a size and geometry to fit can of course be substituted. The Gunn diode is a two terminal device and in the figure one terminal thereof is in contact with the end of screw 8 and, hence, is in electrical contact with inner surface of plate 7. The other terminal of the Gunn diode is in contact with and attached to the top end of conductor 3.

A varactor, 16, a conventional semiconductor element which changes in capacitance as a function of the level of applied direct (DC) bias voltage, is located in between conductors 1 and 3 in the proximity of the Gunn diode. One terminal of varactor 16 is in contact with conductor 1 and the other in contact with conductor 3 so as to form an electrical path therebetween.

A second varactor 17 of like construction to varactor 16 is in like manner connected with its terminals between conductors 3 and 5 and forms an electrical path therebetween. As is illustrated, conductor 5 includes a threaded passage 40 therethrough and a metal screw, not illustrated in the figure, is included therein and protrudes therethrough and at its end is in electrical and mechanical contact with one terminal of varactor 17. The screw supports the varactor, provides an electrical path between the varactor and conductor 5 and exerts pressure on the varactor to hold it in place against post 3. A like structure and screw is included in conductor 1 to support varactor 16 but is not visible in the perspective of FIG. 1. Two generally U-shaped members 19 and 21 of an electrically conductive material, suitably aluminum, of the necessary width are fitted in between plates 7 and 11 on each side of conductors 1, 3 and 5 to form a physically closed container. Members 19 and 21 define a cavity region which is in communication with or open to, as variously termed, the open sided transmission line all along the length thereof. The aluminum is impervious to microwave energy and hence members 19 and 21 provide a shield about the transmission line. A thin mica insulator 23 is located between conductor 5 and shield 19 and electrically insulates one end of shield member 19 from conductor side 5. A second thin mica insulator 25 is located between conductor 1 and shield 19 and insulates electrically the other end of the shield member 19 from contact with the side of conductor 1. As was previously described, the mica insulator 9 also insulates electrically plate 7 from shield member 19. In like manner another insulator 26, suitably mica, is fitted between conductor 5 and shield 21 and insulates shield member 21 from contact with the other side of conductor 5. Still another thin mica insulator 27 is fitted between shield 21 and conductor 1 insulates electrically the other side of conductor 1 from shield member 21. As previously described, insulator 9 mentioned in connection with the plate-like conductive member 7 insulates shield member 21 from contact with plate 7. The edge of plate 7 is spaced slightly from the raised lip portion of shield 21 to prevent electrical contact therebetween. However, it is apparent that an additional insulator can be used to insulate the edge of plate 7 from a projecting lip of shield 21. All of the described insulators are very thin and hence do not permit leakage of microwave energy in the frequency region of interest. A plurality of slabs of microwave loss or dissipative material, such as "Eccosorb," 20, are located on all the inner walls of shield members 19 and 21. A plate 29 is attached to the end of shield member 21. A coaxial connector 31 of conventional construction is mounted therein. A length of coaxial cable 33 is connected at one end through a passage in plate 29 to the back end of connector 31 in a conventional manner, not visible in this figure. At its other end cable 33 has its center conductor 35 in contact with the center conductor 3, suitably in the proximity of Gunn diode 15.

A source of DC bias, suitably 10.0 volts, 37, is connected with its positive terminal in contact with plate 7 and with its negative terminal connected to plate 11 and to an electrical ground, as is symbolically illustrated in the figure. An RC filter network, 38, is placed across source 37. A second source of bias voltage, 39, has its positive terminal connected to both conductor 5 and conductor 1, placing these conductors electrically in common, and has its negative terminal connected to electrical ground, as is symbolically illustrated. Bias source 39 is variable to permit the voltage output to change.

Plate 7 is secured to the shield 19 and 21 members by conventional insulating screws, not illustrated, or by insulating inserts into which metal screws are attached.

Figure 2:
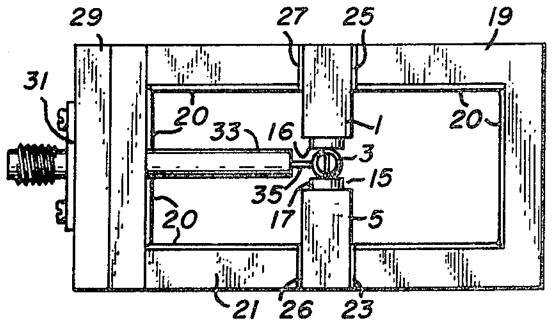
FIG. 2 illustrates in reduced scale a top view with a top wall removed taken along 2—2 of the embodiment of FIG. 1.
Figure 4:
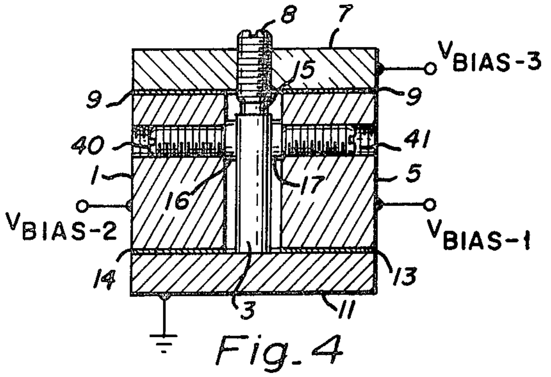
FIG. 4 illustrates in reduced scale a cross-section of the embodiment of FIG. 1 taken along the line 4—4.
Figure 3:
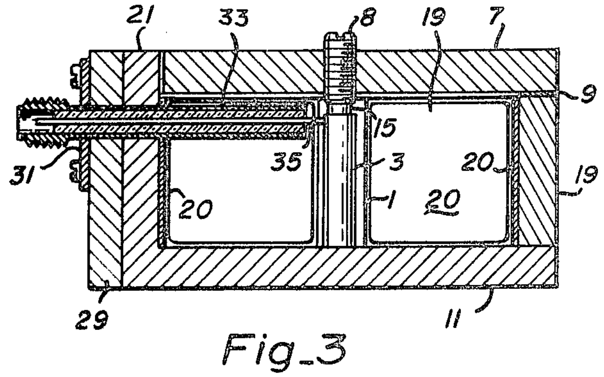
FIG. 3 illustrates in reduced scale a cross-section of the embodiment of FIG. 1 taken along the line 3—3.

To illustrate and clarify further the structural details of the construction of this embodiment additional views of FIGS. 2, 3 and 4 are provided. It is noted that the dimensions of FIGS. 2–4 are reduced in comparison to FIG. 1 and as before the dimensions and shape of the elements are exaggerated for purposes of clearly illustrating the structure. For convenience of the reader, where elements have been assigned numbers in connection with the explanation of FIG. 1 the same numbers are used to identify like elements in FIGS. 2, 3 and 4 which follow.

The top metal plate 7 and underlying insulator 9 is omitted in the top view of FIG. 2. Conductors 1, 3, and 5 are visible viewed from the top end as well as mica insulators 23 and 25 which insulate conductors 1 and 5 from the shield portion 19 and mica insulators 26 and 27 which insulate conductors 1 and 5 from shield portion 21.

The bottom plate or terminating means 11 is visible in the figure as well as Gunn diode 15; varactor 16 is fitted between the conductors 1 and 3 of the transmission line; and varactor 17 is fitted between conductors 3 and 5 of the transmission line. The coaxial cable 33 is connected to coaxial type connector 31 which in turn is mounted on plate 29 and the center conductor 35 of cable 33 is in contact with post conductor 3. The U-shaped shield members define a cavity region which extends on both the left and right sides of the transmission line conductors 1, 3 and 5 and the cavity is seen to be in open communication with the elements of the transmission line all along its open length. The slabs of lossy material 20 are located along the walls of shield members 19 and 21.

FIG. 3 provides a cross sectional view of the oscillator structure as would be afforded by taking a cross section along the line 3—3 in FIG. 1. In this figure the plate 7 and screw 8 clamp diode 15 to the top of conductor 3 and conductor 3 is seated upon and in electrical contact with the bottom plate or terminating means 11. A portion of the conductor 1 is visible from this side of post 3. A portion of the walls of the shield members 19 and 21 are visible as well as the lossy slabs 20 located thereon. Insulator 9 separates top plate 7 from direct electrical contact with shield 19. The coaxial connector 31 is mounted to wall 29 and coaxial cable 33 has its center conductor connected to the post 3.

The cross sectional view of FIG. 4 is obtained by taking a cross section of the structure of FIG. 1 along the line 4—4. This figure illustrates conductors 1, 3 and 5 and the symmetrical spacing therebetween. Plate 7 is secured on the top side and is spaced from the conductors of the transmission line by insulator 9 and diode 15 is clamped in place between plate 7 to the top of conductor 3 with metal screw 8. It is apparent from this figure that the length of center conductor 3 is less than that of the conductors 1 and 5 in order to accommodate therebetween the Gunn diode. The bottom terminating means or plate 11 is insulated from conductors 1 and 5 by insulators 13 and 14, respectively. Plate 11 is connected to and is in electrical contact with the bottom end of the center conductor 3.

Each of the conductors 1 and 5 includes a tapped threaded passage therethrough with respective metal screws 40 and 41 inserted therein. The screws are tightened and abut the varactors to permit the firm electrical contact to be made between the conductors in which they are supported and the corresponding varactor.

It is noted that conductors 1 and 5 can be moved toward or away from the post 3 during assembly prior to firmly clamping the parts together. In so doing the characteristic impedance, $Z_0$, othe transmission line is changed in order to adjust impedance presented to Gunn diode by the circuit.

Figure 5:
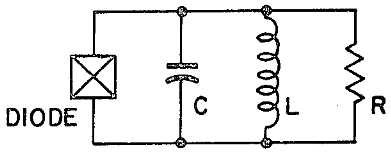
FIG. 5 is a simplified schematic equivalent circuit of the oscillator of my invention.

Basically, this oscillator using a negative resistance characteristic, can be represented by the simplified equivalent circuit of FIG. 5. And in this the Gunn diode is represented as being in parallel circuit with a capacitance, C, an inductance, L, and a resistance, R. In this structure the inductance L is the reactance associated with the short circuited transmission line, while C represents the capacitance placed in parallel by one or more of the varactors 16 and 17, and R represents the resistance of the load to which the oscillator output is coupled.

As is apparent from the preceding figures, the bias potential from source 37 is applied across diode 15 by way of an electrical series circuit path from the one terminal of the source, positive, plate 7, screw 8 to one terminal, the positive, of the diode and from the ground or negative terminal of the source through plate 11 and conductor 3 to the other, negative, terminal of the diode. The voltage of source 37 is sufficient to bias diode 15 into its region of negative resistance so that the diode in the structure generates microwave energy.

With source 39 at zero volts bias, an initial level of effective capacitance between the conductors of the transmission line is provided by each of varactors 16 and 17. Bias source 39 is connected in a circuit through each varactor in a circuit from one lead to the exposed surface of conductor 5 to one terminal of the varactor, the second terminal of varacator 17, and the center post 3 to plate 11 and from thence to ground to which the other terminal of source 39 is connected. Additionally a second lead extends from source 39 to the exposed surface of conductor 1 through one terminal of varactor 16, the remaining terminal thereof, through center post 3, to plate 11 and thence to electrical ground. It is noted that each of the conductors 1 and 5 are placed electrically in common by this connection.

In this manner the electrical leads and paths from the bias source do not expose any substantial openings through which microwave energy can escape. Essentially, the unit is completely shielded. The purpose of the RC filter network is to suppress bias circuit oscillations as is common with Gunn type devices.

Gunn diode 15 is electromagnetically coupled to the transmission line and varactor in an equivalent parallel circuit. Upon application of the bias voltages diode 15 generates microwave frequency energy. This microwave energy travels from conductor 3 by means of the output lead 35 for connection to any electrical load, not illustrated. The output voltage of the varacator bias source is adjusted to different levels and hence changes the effective capacitance in the circuit which in turn changes the resonant frequency of the resonator circuit to which diode 15 is coupled. In this way the frequency of oscillation of the oscillator is changed.

In the oscillator of the invention conductor 3 forms the center conductor of an open sided microwave transmission line and each of the conductors 1 and 5 form outer or ground plane conductors that are essentially placed in parallel by a common connection to the bias supply 39. This transmission line is effectively bounded at one end by an electrically conductive plate 11 which acts as a short circuit at microwave frequencies even though the metal plane is insulated from direct electrical contact with conductors 1 and 5 of the transmission line. In like manner the top plate 7 provides a short circuit effect at microwave frequencies at the upper end of the transmission line, even though plate 7 is also insulated from direct electrical contact with conductors 1 and 5 of the transmission line. And at the location of the Gunn diode the transmission line exhibits electrically an inductance effect. The cavity region formed on each side of the transmission line which is bounded by the shielding means or walls 19 and 21 functions with the plates 9 and 11 to prevent undesired external leakage of microwave energy. Such a cavity region however would normally give rise to unwanted resonances by functioning as a tuned or resonant cavity. By loading the cavity with material that gives rise to high attenuation at microwave frequencies so that the region is free from parasitic resonances, the cavity region is unable to effectively influence the frequency of operation of the oscillator.

Figure 6:
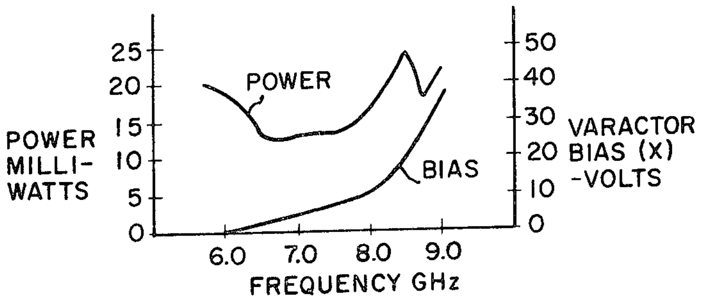
FIG. 6 illustrates graphically the performance results of a specific example of the embodiment illustrated in FIG. 1.

In a specific example of the preferred embodiment the length of the transmission line was made approximately 0.25 inches which corresponds to 0.21 wavelengths at a frequency of 10 GHz. A bias voltage of −10 volts was applied to the Gunn diode and an adjustable bias source of between 0 and −50 volts DC was connected to the varactors. As evidenced by the graph of FIG. 6 output powers of between approximately 12 to 24 milliwatts was obtained by varying the varactor bias voltage over a range of between 0 to 42 volts with frequencies over the range of 6 to 9 GHz. Considered from the initial frequency of 6 GHz the additional 3 GHz represents essentially a 50 percent of an octave tunable bandwidth. By comparison available commerical solid state devices oscillators known to applicant are capable of obtaining no more than a 20 percent tuning bandwidth. An additional factor or result evidenced in the graph is that the power output of the oscillator was fairly uniform at 13 milliwatts over a frequency range of 6.5 to 7.5 GHz while substantially varying the varactor bias voltage over a range of 4 to 8 volts linearly. This is obviously a significant advantage where in those applications in which tuning linearity is required.

From a practical standpoint the oscillator structure provides a complete sealed package which confines microwave energy allowing it to exit solely from the output coupling connector 31.

Inasmuch as copper plate 7 is of a large surface area, substantially larger than the diode, it serves an additional function as a heat sink or heat dissipating surface. All diodes generate heat during operation and this heat is, preferably, conducted away or otherwise dissipated in order to prevent damage to the diode.

In one modification, conductor 5 and the attached varactor 17 can be eliminated altogether, making the transmission line essentially an open sided two wire transmission line. In this instance the remaining varactor 16 is used to vary the frequency of the oscillator. Such a modification further requires the ends of the shield members 21 and 19 to be joined so as to maintain the inner cavity region sealed against leakage of microwave energy.

Figure 7:
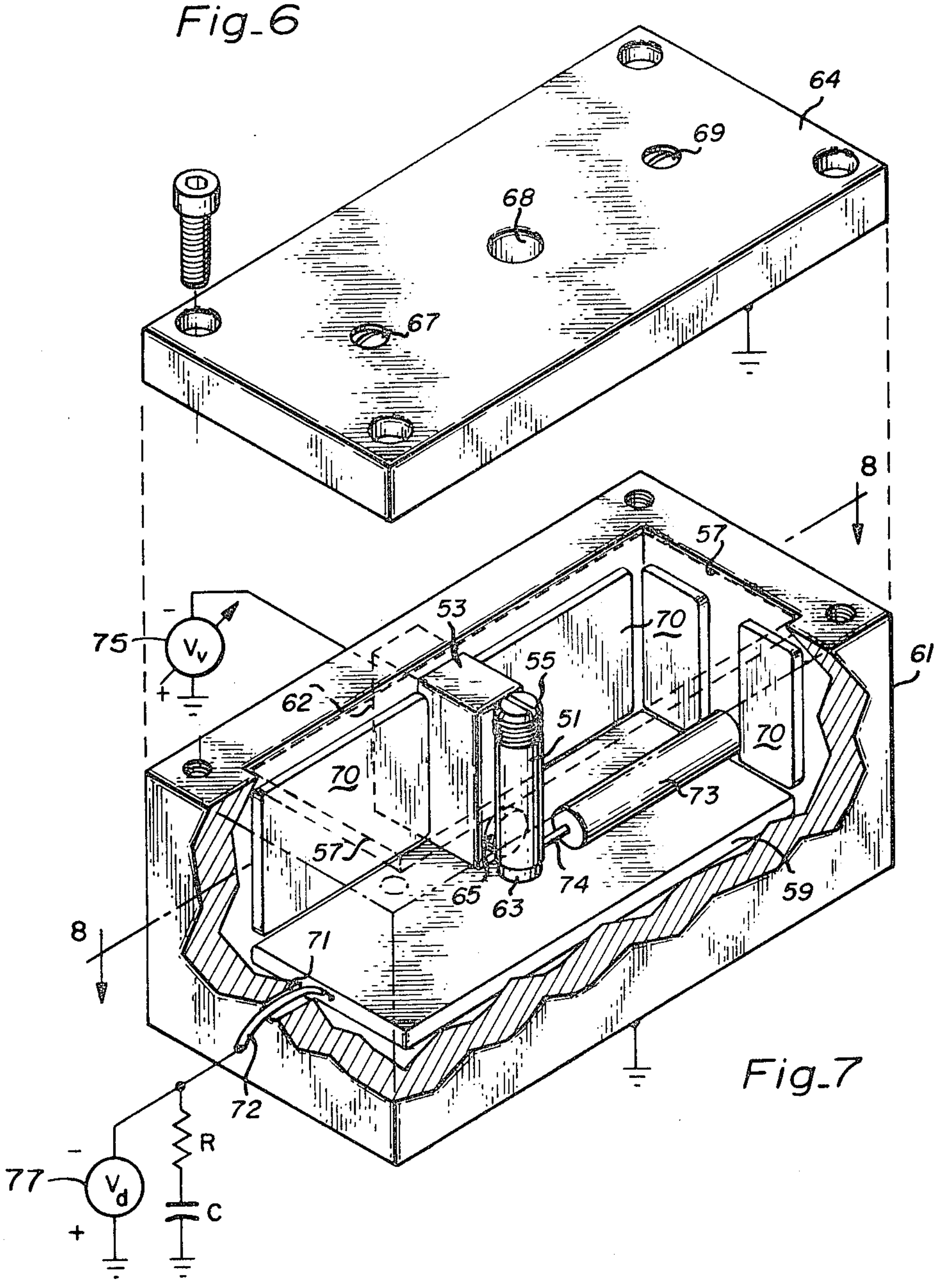
FIG. 7 illustrates in perspective a partially exploded view of another embodiment of my invention.

By way of further example of my invention, an additional embodiment is presented and discussed in connection with FIGS. 7, 8 and 9 which follows:

In order to provide a perspective view of the elements in the embodiment of FIG. 7 some portions of the structure are illustrated by dashed lines and are made "invisible" and a portion of the figure is exploded. In addition, some enlargement and exaggeration of the relative geometry and dimension of the elements provides a more informative illustration.

In this embodiment a cylindrical metal post 51 of electrically conductive material is spaced from and parallel to a rectangular metal member 53 of electrically conductive material, suitably aluminum, and these two spaced metal members form the microwave transmission line of a length corresponding to the height dimension as illustrated in the figure of those elements. Cylindrical post 51 includes a threaded portion 55. The threaded portion is screwed into a tapped hole in a rectangular metal plate 57, an electrical conductor, suitably copper, the latter of which is represented by dashed lines and made "invisible" in order to permit an internal view of the oscillator structure, and metal plate 57 forms a short circuit termination to the formed transmission line of post 51 and conductor 53 at microwave frequencies as in the preceding embodiment. Rectangular metal conductor 53 is suitably "anodized" on its top, right and left side and bottom surfaces to form there a thin aluminum oxide layer. The oxide layer is an electrical insulator and the insulative layer prevents a DC electrical path between conductor 53 and plate or terminating means 57, underlying plate 59 and the side walls of container 61. A second large metal plate, suitably copper, 59, is located at the bottom end of conductors 51 and 53 and is seated on the bottom surface of the shielding metal container 61. Metal plate 59 forms a short circuit termination effective at microwave frequencies at the bottom end of the transmission line formed of the two spaced conductors, member 53 and post 51, although, as noted, insulated from direct electrical (DC) connection with both of those conductors. The shielding container 61 is, essentially, a hollow metal box with thick walls and is constructed of an electrically conductive material, suitably aluminum. The inner walls and bottom surface floor of container 61 are anodized to form a thin electrical insulating layer thereon. This layer insulates electrically the container floor from direct electrical contact with terminating means 59. As is apparent, other forms of insulating layers can be used as an alternative, but the insulating layer formed by anodization is preferred.

Gunn diode 63 is located between the bottom end of conductor post 51 and terminating plate 59 with one diode terminal, the positive in electrical contact with the end surface of post 51 and with the other diode terminal, the negative, in direct electrical contact with plate 59. A varactor 65 is located in between conductors 51 and 53 with one of its terminals connected to conductor 51 and its other terminal in contact with conductor 53 which places the varactor in an electrical circuit therebetween. The varactor is placed so that its edge is in line with the bottom end of conductor post 51. A metal lid or top cover 64, suitably of aluminum, illustrated in exploded position covers the open top side of the container so as to provide a fully self-contained unit impervious to microwave energy. The cover is secured to the top of container 61 by any conventional means, such as screws, only one of which, for example, is illustrated. Cover 64 includes two tapped passages within which are received two short screws 67 and 69, and a hole 68 in its center of suitable size to insert a screwdriver to tighten down conductor 51.

With cover 64 installed in place the screws 67 and 69 are advanced so that they protrude through the underside of the cover and contact two spaced portions of underlying plate 57 (represented by dash lines) as hereinafter becomes more apparent, so as to place as a slight pressure on plate 57. After this is done, conductive post 51 is tightened down with a screwdriver accessing through hole 68 to threaded portion 55 of post 51, and that forces the end of conductor 51 into firm contact with the terminal of diode 63 to form a somewhat clamp-like union between the conductor and the diode.

Slabs of microwave dissipative or loss material 70, such as "Eccosorb," are located all about the walls of the container. Additional slabs of microwave dissipative material, eliminated from the figure for clarity, are included along the front and most immediate side walls of the container.

A rectangular shaped passage 62 is located in the back wall of the container. The passage walls are also anodized so as to provide an insulating layer thereon to prevent direct electrical contact with conductor 53. Conductor member 53 is of such a geometry and dimension as to extend through and fill the passage. In this way, conductor member 53 is accessible from the outside of container 61. Another passage 71 extends through the immediate side wall of container 61 and an insulated electrical lead 72 extends through the passage. Lead 72 is connected internally of container 61 to plate 59 and provides an electrical path thereto from a location external of container 61.

The center conductor 74 of a length of coaxial cable 73 is connected in the proximity of diode 63 to conductive post 51, preferably just by the bottom of the post. A conventional coaxial connector, not illustrated, is located on the distant side wall of the container, external thereof, and is connected to the coaxial cable. The cable and connector provide a microwave energy output coupling from the container. An electrical load is coupled in a conventional manner to this output coupling at the connector.

A source of bias voltage, 75, symbolically illustrated, is connected between electrical ground and to conductor 53. As is conventional, source 75 is adjustable to provide any voltage between 0 and −50 volts. As illustrated in the figure, the container 61 and cover 64 are also connected to a common electrical ground. A current path is thus established between the negative terminal of the source 75 through conductor 53, varactor 65, conductor 51, post extension 55, metal plate 57 and screws 67 and 69 in parallel, and cover 64 to electrical ground and from ground to the positive terminal of source 75.

A source of diode bias voltage 77, suitably 10 volts DC, as symbolically illustrated in the figure, has its positive terminal connected to electrical ground and its negative terminal connected to electrical lead 72. As is conventional, a series R-C network which forms a low pass filter is connected in shunt across source 77 so as to prevent low frequency bias circuit oscillations that are common to Gunn diode devices. A current path is established from source 77 to diode 63, from the negative terminal of source 77, lead 72 to plate 59, to the negative terminal of diode 63, through diode 63, conductor 51, plate 57, screws 67 and 69 in parallel, plate 64 to electrical ground and from electrical ground to the positive terminal of source 77.

Figure 8:
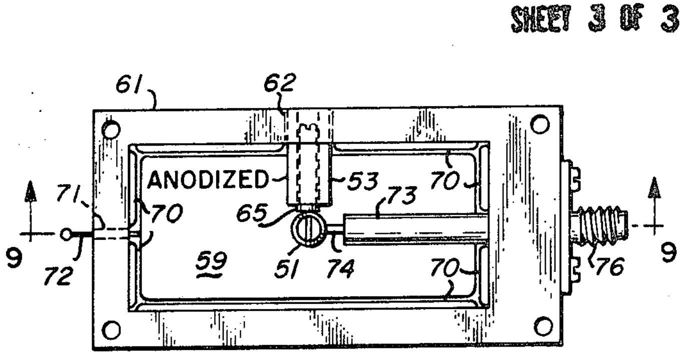
FIG. 8 illustrates in reduced scale a top view with a top cover and metal plate removed, taken along line 8—8 of the embodiment of FIG. 7.
Figure 9:
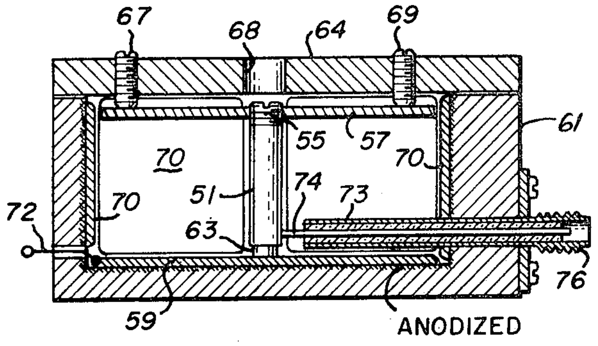
FIG. 9 illustrates a cross-section of the embodiment of FIG. 8 but with top cover and metal plate added, taken along line 9—9 of FIG. 8.

To more fully illustrate the arrangement of elements in this embodiment of the invention, a top view and a cross sectional side view, drawn to a reduced scale, is provided in FIGS. 8 and 9. Those elements in FIGS. 8 and 9 which are common to FIG. 7 are, for the convenience of the reader, similarly labeled.

The view of FIG. 8 represents a top view of the elements of the embodiment with metal cover 64 and the short circuit terminating metal plate 57 found in FIG. 7 deleted for clarity. The cylindrical conductor post 51, includes a threaded passage 54 and is located adjacent and spaced from conductor member 53, and in this view one is looking down the two wire transmission lines formed between conductors 51 and 53. Varactor 65 is connected with its terminals between conductors 51 and 53. Conductor member 53, as illustrated by the dashed hidden line portion, extends through passage 62 in the back wall of metal container 61. The coaxial cable 73 has center conductor 74 connected to conductor 51 and at its other end is connected in a conventional manner to the coaxial connector 76 mounted on the side wall of the container. The metal terminating plate 59 is disposed in the bottom of container 61 and electrical lead 72 extends through passage 71 in the side wall of container 61 and is connected to bottom terminating plate 59. Suitably disposed and attached to all of the inner walls of container 61 are slabs 70 of microwave loss material.

The cross-sectional view of FIG. 9 is taken along the lines 9—9 of an embodiment of FIG. 8, in which the metal cover and terminating metal plate are included. This shows metal shielding container 61 and cover 64. The aluminum oxide layer on the inner surface of container 61, which was treated by a conventional anodizing process to form an electrically insulative aluminum oxide layer is represented in the figure by a series of short hatch lines. Metal terminating plate 59 is seated on the bottom surface of the container. The upper terminating plate 57 has attached therethrough cylindrical conductor 51 by means of thread end 55 and Gunn diode 63 is compressed in between the bottom of conductor 51 and plate 59. Screws 67 and 69 apply pressure to the top of plate 57 and also complete an electrically conductive path between cover 64 and plate 57. The lossy slabs 70 are visible on the back wall as well as on the inner side walls of container 61 in this cross-sectional view. Coaxial connector 76 is located on the right side wall and has connected thereto the coaxial cable 73. At the center conductor at the other end the coaxial cable is connected to conductor 51 in the vicinity of the Gunn diode 63. Electrical lead 72 extends from the exterior of container 61 through a passage therein and is connected to bottom terminating plate 59. Not visible in this figure is the second conductor of the transmission line located behind conductor 51 and the varactor fitted therebetween.

The sequence of assembly of the elements in the embodiment of FIG. 7 is not necessarily apparent from the drawing and is therefore briefly explained.

Given the container 61 with mounted lossy slabs 70 in position, plate 59 seated on the container bottom surface and appropriately connected to electrical lead 72, the metal conductor member 53 is slid in through the passage partially into the cavity. Member 53 carries with it varactor 65. Center conductor post 51 has attached and carries diode 63 at its end and this post is screwed into plate 57 by means of threaded portion 55 to a depth that does not permit diode 63 to contact terminating plate 59. Electrical conductor 74 is then attached to post 51 at a location adjacent diode 63 and the assembly of plate 57 and post 51 is then placed down in the cavity. The cover 64 is then mounted atop the open end of the container and screwed in place by means of screws not illustrated. At this time, screws 67 and 69 are inserted through cover 64 to a depth at which they abut and press against the underlying terminating plate 57. Subsequently, a screwdriver is inserted through opening 68 and into the slot in the threaded end 55 of the center conductor 51, and conductor 51 is turned and advances forward relative to plate 57. Accordingly, the diode 63 is lowered into firm contact and pressing contact with bottom metal plate 59 and the entire assembly is rigidly installed. Finally, the screw which supports varactor 65 in member 53, as is represented in FIG. 8, is rotated and advanced into the cavity further so that the other terminal of varactor 65 abuts and tightly contacts post 51.

The theory of operation of the embodiment of FIG. 7 is essentially the same as that of the preceding embodiment as is apparent to the reader. Basically the difference is such as to provide in this embodiment an oscillator of a more flexible design in that the length of the transmission line can be adjusted by merely fabricating two parts: center conductor 51 and ground plane 53.

The conductors 51 and 53 form an open wire transmission line which is believed to be less than a quarter wavelength, for example 0.25 inch at a frequency of 10 GHz, which corresponds by simple calculation to 0.21 wavelengths, that is effectively short circuited at an end to energy in the microwave frequency region by the upper plate 57, even though the upper surface of conductor 53 is anodized and electrically insulative as described heretofore in the specification to provide DC isolation between plate 57 and conductor 53, and lower terminating plate 59, which likewise is DC isolated from conductor 53 by the anodized surface of the latter as previously described, so as to provide an effective electrical inductance and low impedance coupling to the Gunn diode. And varactor 65 provides the effective capacitance so as to form a tuned circuit. The surrounding walls of the metal container 61 form a shield around the transmission line and define a cavity region open to and in communication with the fields along the transmission line. The cavity is free of parasitic resonances due to the action of the absorbing slabs 70, and hence the field confining cavity does not influence or interfere with the tuning network formed by the pair of conductors. In other respects the oscillator is tuned by adjustment of the varactor bias voltage level as described in connection with the preceding embodiment and the microwave energy output is coupled via conductor 74 to any suitable electrical load.

It is apparent that each of the terminating plates can be reduced in size and a different packaging arrangement used. However it is preferred for both plates to be larger in surface area substantially than the cross-section of the transmission line. In operation the Gunn diode generates heat which must be removed. Thus plate 59 is of a large surface area and serves to more effectively dissipate such heat to the body 61. Plate 57 is preferably of such a large area to mechanically receive the ends of screws 67 and 69 on cover 63 so as to hold the elements mechanically in place.

One significant difference between the embodiment of FIGS. 1 to 3 and the embodiment of FIGS. 7 to 9 is that the construction of the latter embodiment is more flexible and permits a change in the base or center frequency of the oscillator with minimal change in the shape or geometry of elements. For example, to construct a new oscillator having a lower base frequency in accordance with the embodiment of FIGS. 7 to 9 a post, such as 51, but slightly greater in length, is incorporated as well as a longer conductor 53. In such a construction, screws 67 and 69 would not extend as far under cover 64 in order to exert a force on end plate 57. Conversely, to construct an oscillator having a higher base frequency a post 51 and conductor 53 of shorter length are substituted. And in that event the pressure screws 67 and 69 would extend further beyond plate 64 in engaging end plate 57. However it is clear that all other elements of the unit including the shielding container 61, cover 64, loss material are unchanged in size and geometry. Substantially all of the parts comprising the oscillator of FIGS. 7–9 are interchangeable independent of the base frequency of the oscillator. Thus the inventory of parts required to manufacture oscillators having different base frequencies is considerably reduced and provides substantial savings. By contrast, were the length of center conductor 3 in the embodiment of FIG. 1 to be made greater in length, the size of the container walls must also be raised in height.

While the varactors 16 in FIG. 1 and 65 in FIG. 7 may be positioned in between the two conductors forming the respective short circuited transmission line at various locations between the ends of the line, it is best positioned with the outer side edge of the varactor in line with the bottom end of the center conductor as I have illustrated in the embodiment of FIGS. 1 and 7 and at this position the varactor is most effective and results in obtaining the widest possible tuning characteristic from a given varactor.

Moreover, the output line 35 in FIG. 1 and 74 in FIG. 7 is directly connected to the end of the respective center conductor 3 in FIG. 1 and 51 in FIG. 7, forming the transmission line as indicated adjacent the Gunn diode. While other points of connection are suitable for obtaining microwave frequency energy, I have found that this location for the connection obtains the best power versus tuning characteristic, permits coupling out the largest levels of microwave power. This feature provides a considerable advantage in assembling the oscillator since little skill is required of the technician and the technician merely connects the output lead to the prescribed location and in so doing the first and best connection is made. By contrast, those prior art oscillators which use cylindrical resonators and output coupling loops for coupling to the electromagnetic fields for optimum power output had to be moved around the cavity chamber and each power output measured until it was determined that a certain position derived the maximum field coupling and power output and this procedure had to be followed with each oscillator assembly inasmuch as at such small physical dimensions no two oscillator assemblies are precisely alike. Such tedious tailoring of the output coupling loops obviously renders production difficult and expensive. That aspect of the construction of my invention which wholly eliminates that tedious and time consuming procedure by itself is a singular and beneficial achievement.

Figure 10:
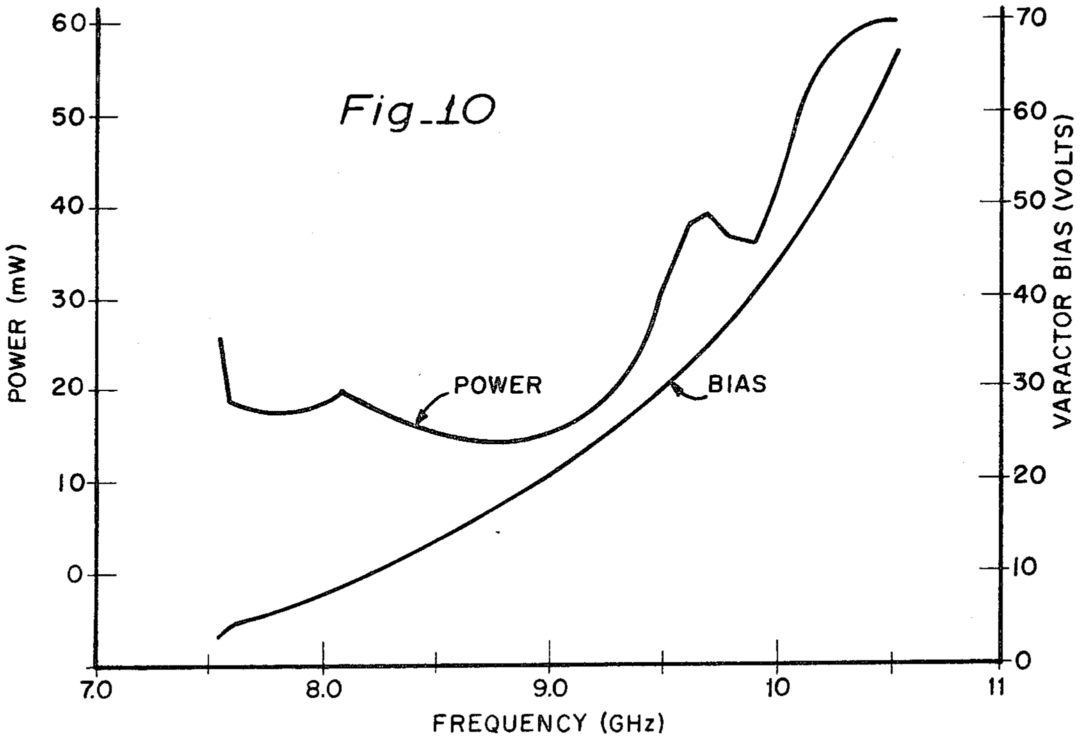
FIG. 10 illustrates graphically the performance results of a specific example of the embodiment of FIG. 7.

In one specific example of an oscillator constructed in accordance with the embodiment of FIG. 7 I have obtained the results graphically illustrated in FIG. 10. Thus the oscillator was tuned over a frequency range of 7.5 to 10.5 GHz and the power output was equal to or above 15 milliwatts.

Figure 11:
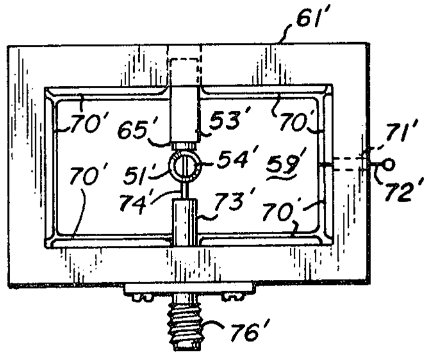
FIG. 11 illustrates a top view of still another embodiment of the invention.

A further modification to the embodiment of FIG. 8 is presented in FIG. 11. For convenience, only a top view of the oscillator of this embodiment need be illustrated inasmuch as the arrangement of the elements are understood from the description of the preceding embodiments and this one view serves to illustrate the modification. Further those elements in FIG. 11 which correspond to the elements in FIG. 7 are given the same numerical designation and are primed. Since all elements have been adequately described previously in connection with the preceding embodiment, such description need not be here repeated. Essentially the output coupling means, which includes connector 76, cable 73 and lead 74, is relocated so that the connector 76' is situated in the front wall and cable 73' extends in the plane containing the axes of conductors 51' and 53' to the connection of lead 74' with conductor 51'. As is apparent, this allows the size of the shielding container 61' to be shorter in length than the corresponding length of container 61 in FIG. 8. This is possible inasmuch as the cavity containing the two wire transmission lines 51' and 53' and the loss material 70' does not have a substantial influence on the base frequency of the oscillator. Thus a considerable reduction in the size of the oscillator unit results.

The preceding description of the different embodiments of my invention clearly present to the reader skilled in the art all necessary details with which to enable such person to make and use my invention. However it is understood that the details presented in connection with the description of those embodiments are not to be construed in the sense of limiting my invention, inasmuch as many other equivalent arrangements of the elements and substitutions for various ones of the elements as well as modifications of the disclosed structure in addition to those described herein become apparent to one of ordinary skill upon reading this detailed description of my invention.

Thus the positive polarity terminal and negative polarity terminal of the Gunn diode are assigned under the convention in which the diode functions as a negative resistance device for its intended purpose when those terminals are connected to like terminals, positive and negative of a conventional source of voltage. While the bias source 37 in FIG. 1 and 77 in FIG. 7 are shown with their positive and negative polarity terminals connected in electrical circuit with respective elements, it is apparent that the source polarity can be reversed if the corresponding Gunn diode is "turned" over or reversed in position so that its positive and negative polarity terminals are reversed in position and the oscillator will function.

Additionally, I have chosen to use insulated electrical leads which extend through wall passages in the preceding embodiments. As is apparent, however, conventional connectors can be installed in the walls, and the bias source may be connected by means of those connectors.

Accordingly it is expressly understood that my invention is to be broadly construed within the spirit and scope of the appended claims.

What I claim is:

1. The microwave oscillator which comprises in combination:

a. a microwave transmission line of a predetermined length between its first and second ends, said line including,
   ai. a first length of electrical conductor,
   aii. a second length of electrical conductor,
   aiii. said second length of electrical conductor being spaced from and substantially parallel with said first length of conductor;
b. first terminating means comprising an electrical conductor located at said first end of said transmission line for providing a microwave frequency energy short circuit termination to said first end of said transmission line;
c. second terminating means comprising an electrical conductor located at said second end of said transmission line and in microwave energy coupling relationship with an end of said first length of electrical conductor;
d. said second length of conductor of said transmission line in addition being connected at one end electrically in common with said first terminating means;
e. microwave energy generating diode means, said diode means being located in between said second terminating means and a remaining end of said second length of conductor of said transmission line;
f. first capacitance means, said capacitance means being located in between said first and second lengths of conductors of said transmission line to provide a predetermined effective capacitance therebetween and forming therewith a frequency determining resonator circuit;
g. microwave energy impervious shielding means located about said transmission line for defining a cavity region adjacent said transmission line, said cavity region being in open communication with said transmission line substantially all along the length of said transmission line;
h. microwave energy dissipating means located in said cavity region for rendering said region a low "Q" electrical characteristic whereby said cavity region is prevented from functioning as a resonator circuit; and
i. microwave energy coupling means coupled to said second length of line of said transmission line for coupling microwave energy therefrom to a load.

2. The invention as defined in claim 1 wherein said microwave transmission line further comprises: a third length of electrical conductor, said third length being spaced from and substantially parallel with said second length and being positioned on a side thereof opposite from that of said first length of electrical conductor, means placing said third length and said first length of electrical conductor electrically in common; and said invention comprising further: second capacitance means, said second capacitance means being located in between said second and third lengths of conductors of said transmission line to provide a predetermined effective capacitance therewith effectively in parallel with said first capacitance means.

3. The invention as defined in claim 1 wherein said microwave energy generating diode means comprises a Gunn diode; and wherein said capacitance means comprises a varactor.

4. The invention as defined in claim 1 wherein said first length of conductor comprises a vane shaped geometry and wherein a narrow edge of said vane is positioned facing said second length of conductor; and wherein said second length of conductor comprises the geometry of a cylinder.

5. The invention as defined in claim 1 wherein said first capacitance means is connected electrically in circuit between said first and second conductor lengths; and further comprising: means insulating said first length of conductor from direct electrical contact with said terminating means and said shielding means, and bias source means connected between said first conductor and said first terminating means for applying a voltage across said first capacitance means; means connecting said diode means electrically in series circuit between said remaining end of said second length of conductor and said second terminating means to complete a direct current path therethrough; diode bias source means; and means for connecting said diode bias source in circuit between said second terminating means and said first terminating means; and insulating means for insulating said second terminating means from direct electrical contact with said conductors of said transmission line and with said shielding means.

6. The invention as defined in claim 1 wherein said capacitance means and said coupling means are connected proximate said diode means.

7. An oscillator which comprises:

a Gunn diode, an open transmission line having a front and back end, said transmission line comprising at least first and second spaced electrical conductors, each of said conductors having corresponding front and back ends, first electrically conductive microwave frequency short circuit terminating means disposed at the front end of said transmission line and in microwave energy coupling relationship with the front end of said first conductor;

second electrically conductive microwave frequency short circuit terminating means coupled to the back end of said transmission line for providing a short circuit to microwave frequency energy at the back end of said transmission line;

said Gunn diode being located in between said first terminating means and said front end of said second conductor of said transmission line;

microwave energy impervious shielding means located about said transmission line and defining a cavity region open to the space between said spaced conductors all along the length of said transmission line, microwave loss material disposed within said defined cavity region to provide a low "Q" electrical characteristic for said defined cavity region, varactor means located in between said first and second spaced electrical conductors to provide a capacitance therebetween, and microwave energy coupling means connected to said second conductor for coupling microwave energy through said shielding means.

8. The invention as defined in claim 7 wherein said shielding means comprises a hollow metal container.

9. The invention as defined in claim 8 wherein said Gunn diode includes a first electrical terminal and a second electrical terminal and wherein said first terminal is connected to said first conductor and said second terminal is connected to said first terminating means to complete a DC electrical path therebetween and electrical insulator means for insulating said first terminating means from direct contact with said first conductor of said transmission line.

10. The invention as defined in claim 9 wherein said varactor includes a first electrical terminal and a second electrical terminal and wherein said first terminal is connected electrically in common with said first conductor and said second terminal is connected electrically in common with said second conductor.

11. The invention as defined in claim 10 wherein said first conductor includes a portion which extends through said shielding means, an opening in said shielding means to accommodate said extended portion, and insulating means insulating said portion from direct electrical contact with said shielding means.

12. The invention as defined in claim 11 further comprising means connecting together said second terminating means and said shielding means electrically in common.

13. The invention as defined in claim 7 wherein said varactor is positioned in the space between said first and second conductors with a side edge in line with the front end of said first conductor.

14. The invention as defined in claim 13 wherein said microwave energy coupling means is connected to said one conductor at a location thereon most proximate said Gunn diode.

15. A solid state oscillator comprising:

first and second electrical conductors, said conductors being of respective predetermined lengths and spaced from one another by a predetermined distance to form a two-wire transmission line;

first and second electrically conductive metal planar surfaces spaced apart by a predetermined distance and oriented substantially in parallel;

said first and second conductors being located at least partially in between and traversing a substantial portion of the distance between said surfaces with said formed transmission line oriented in between and substantially orthogonal to said metal surfaces;

said first conductor having one end in direct contact with said first metal surface;

a Gunn diode, said Gunn diode being positioned between the remaining end of said first conductor and said second metal surface;

said second electrical conductor being insulated from direct contact with said first and second metal surfaces;

varactor means, said varactor means being located in the space between said first and second electrical conductors at an end thereof proximate said Gunn diode;

shielding means bordering at least the space about said first and second metal surfaces to form with said metal surfaces a closed electromagnetic cavity;

microwave dissipative material located in said cavity to render said cavity a low "Q" electrical characteristic;

first bias source means for providing a bias voltage to said Gunn diode;

second bias source means for providing a bias voltage to said varactor; and output coupling means connected to said first electrical conductor adapted to couple microwave energy through said shielding means to a load.

16. The invention as defined in claim 15 wherein said shielding means is insulated electrically from said second metal surface and wherein said first bias source means includes a first polarity terminal and a second polarity terminal; means electrically connecting first polarity terminal to said second metal surface and means electrically connecting said second polarity terminal electrically in common with said shielding means; and means connecting said first metal surface electrically in common with said shielding means.

17. The invention as defined in claim 16 wherein said microwave output coupling means is connected to said first conductor at a location therealong adjacent said remaining end.

18. The invention as defined in claim 17 wherein said second bias source means includes a first polarity terminal and a second polarity terminal; means connecting said first polarity terminal in common with said second electrical conductor and means connecting said second polarity terminal in common electrically with said shielding means.

19. A solid state oscillator assembly which includes:

a hollow metal container having an open end;

a metal plate disposed on the inside bottom surface of said container;

means electrically insulating said metal plate from direct electrical contact with said bottom surface of said container;

a Gunn diode, said Gunn diode having one polarity terminal on one surface and an opposite polarity terminal on an opposed surface, said Gunn diode being disposed at a predetermined position on said metal plate with said first polarity terminal in contact therewith;

an elongated cylindrical conductive post having first and second ends, a slot in said first end and a screw thread formed in said outer surface of said post at said first end;

a second metal plate having a surface area slightly less than the cross-sectional area of said opening of said container and adapted to be received within said container;

said second metal plate containing a threaded opening and said metal post having its threaded end received in engaging relationship within said threaded opening in said second metal plate and having its remaining end in contact with the second polarity terminal of said Gunn diode;

a metal cover for said container adapted to close the open end of said container;

said cover including a first opening aligned with said slotted end of said metal post for permitting access to said slot in said post, and a plurality of spaced threaded passages; and a plurality of set screws in said passages, said set screws having their ends abutting said second metal plate; and means fastening said cover to said container; whereby said Gunn diode is compressively positioned and held in position within said container.

20. The invention in a solid state oscillator assembly as defined in claim 19 which further includes:

an opening in a side wall of said container;

a rectangular shaped metal conductor protruding through said passage into said container and having an elongated front edge spaced from said conductive post;

a passage extending through said rectangular conductor from its back end to said front edge, said passage including thread means for engaging a screw means;

elongated metal screw means in said passage having an end protruding beyond said front edge;

a varactor, said varactor having a first polarity terminal and a second polarity terminal;

means mounting said varactor to said screw means with direct electrical contact between said first polarity contact and said screw means, said screw means being advanced to force said second polarity terminal of said varactor to contact said cylindrical post; and means electrically insulating said rectangular metal conductor from said container and from said first and second metal surfaces.

21. The invention as defined in claim 20 further comprising:

a plurality of slabs of microwave dissipative material mounted to and located about the inner wall surfaces of said container in between said first and second metal plates;

first electrical lead means, said electrical lead means being electrically connected to said cylindrical metal post at a position approximate said Gunn diode for providing an electrical path therefrom to a location external of said container; and second electrical lead means connected to said first metal plate for providing a current path thereto from a location external of said container.

* * * * *